(12) United States Patent
Proctor et al.

(10) Patent No.: US 9,736,964 B2
(45) Date of Patent: Aug. 15, 2017

(54) DEVICE COVER FOR THERMAL MANAGEMENT

(71) Applicant: THOMSON LICENSING, Issy de Moulineaux (FR)

(72) Inventors: Christopher Michael William Proctor, Westfield, IN (US); Sin Hui Cheah, Carmel, IN (US); Girish Naganathan, Fishers, IN (US)

(73) Assignee: Thomson Licensing, Issy-les-Moulineaux (FR)

( * ) Notice: Subject to any disclaimer, the term of this patent is extended or adjusted under 35 U.S.C. 154(b) by 0 days.

(21) Appl. No.: 14/778,740

(22) PCT Filed: Jun. 27, 2013

(86) PCT No.: PCT/US2013/048124
§ 371 (c)(1),
(2) Date: Sep. 21, 2015

(87) PCT Pub. No.: WO2014/209316
PCT Pub. Date: Dec. 31, 2014

(65) Prior Publication Data
US 2016/0044827 A1    Feb. 11, 2016

(51) Int. Cl.
*H05K 7/20*    (2006.01)
*H05K 1/02*    (2006.01)

(52) U.S. Cl.
CPC ....... *H05K 7/20127* (2013.01); *H05K 1/0203* (2013.01); *H05K 7/20436* (2013.01)

(58) Field of Classification Search
CPC ............. H05K 7/20172; H05K 5/0213; H05K 7/20181; H05K 7/20145; H05K 7/20136;
(Continued)

(56) References Cited

U.S. PATENT DOCUMENTS 6,049,469 A *  4/2000  Hood, III ................ G06F 1/182
                                                    174/388
6,388,189 B1 *  5/2002  Onoue ................. H05K 7/2039
                                                    174/383
(Continued)

FOREIGN PATENT DOCUMENTS

WO    WO2012050291    4/2012
WO    WO2012122230    9/2012

OTHER PUBLICATIONS

Search report mailed Mar. 3, 2014.

*Primary Examiner* — Adam B Dravininkas
(74) *Attorney, Agent, or Firm* — Myers Wolin LLC

(57) ABSTRACT

An electronic device includes a cover for one or more heat generating components, with the cover providing at least a combined conductive, convective, and radiant cooling for the heat generating components while maintaining the device within a prescribed temperature range. Conductive cooling is realized by providing thermal coupling between each of two or more depression regions in the cover and one or more heat generating components. Appropriate placement of air inlets and outlets through the cover provides convective cooling of the heat generating components and the thermally coupled depression regions. Heat from the heat generating components thermally coupled to one depression region is effectively isolated from heat generated by other heat generating components thermally coupled to another adjacent depression region at least in part via the air outlets through an interior region between the two adjacent depression regions. Radiant cooling can also be improved by increasing the emissivity of the device cover material.

16 Claims, 1 Drawing Sheet

(58) Field of Classification Search
CPC .............. H05K 7/20581; H05K 1/0203; H05K 7/20127; H05K 7/20436
USPC ........... 361/679.54, 692, 693, 702, 704–711, 361/714–723
See application file for complete search history.

(56) References Cited

U.S. PATENT DOCUMENTS

| | | |
|---|---|---|
| 8,050,028 B2 | 11/2011 | Merz et al. |
| 2004/0036819 A1* | 2/2004 | Ryu ...................... G06F 1/1601 349/58 |
| 2005/0111195 A1 | 5/2005 | Wu |
| 2006/0215357 A1* | 9/2006 | Green ....................... G06F 1/20 361/678 |
| 2011/0199748 A1* | 8/2011 | Kagawa ............. H05K 7/20436 361/796 |
| 2011/0205710 A1* | 8/2011 | Kondo ................... H05K 9/006 361/714 |
| 2012/0243176 A1 | 9/2012 | Ritter et al. |
| 2012/0307455 A1* | 12/2012 | Ritter ................ H05K 7/20445 361/720 |
| 2013/0050942 A1 | 2/2013 | Konishi |
| 2013/0063895 A1 | 3/2013 | Ritter et al. |
| 2013/0347051 A1* | 12/2013 | Bose ................... H04N 21/418 725/151 |

* cited by examiner

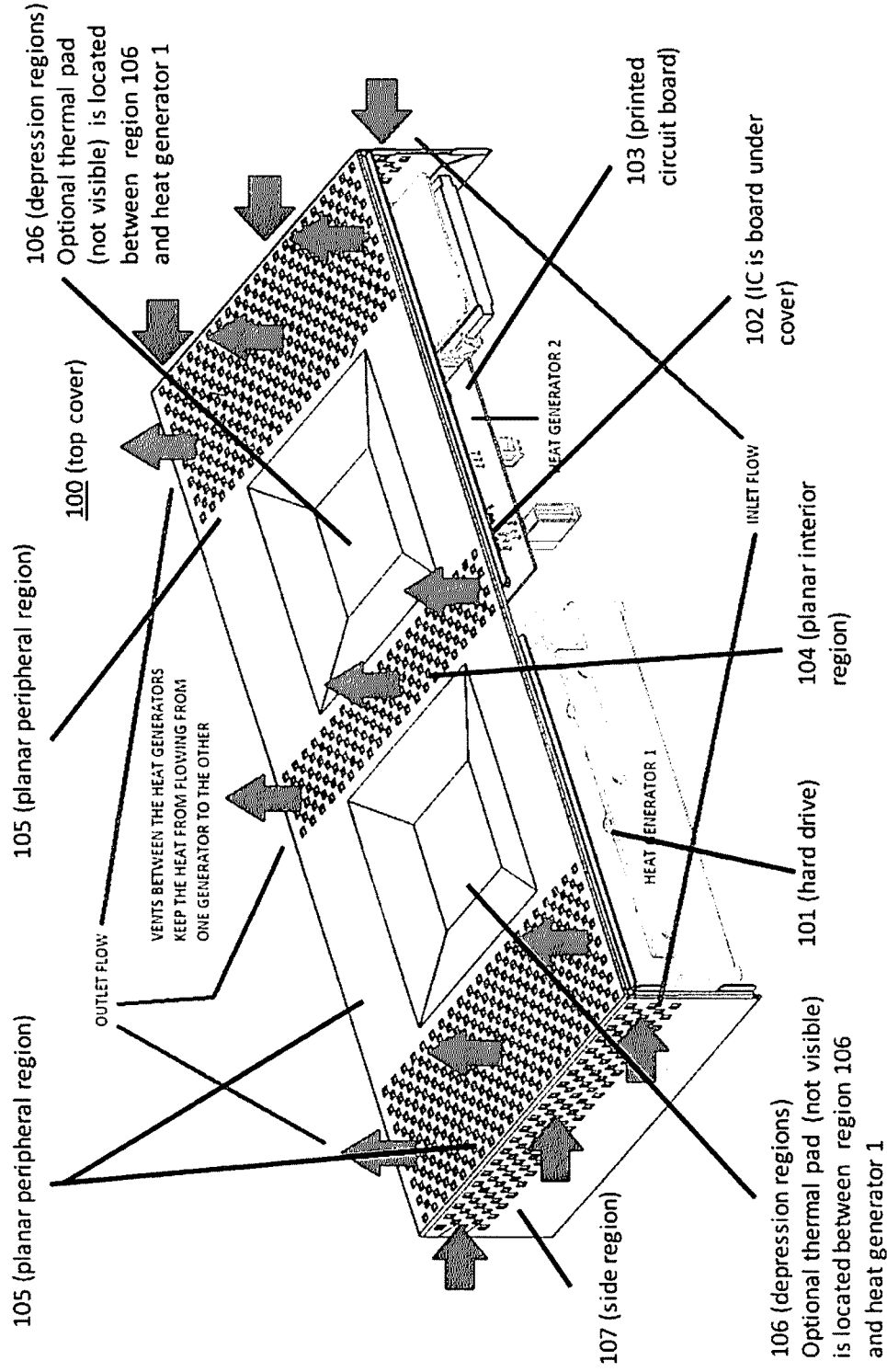

DEVICE COVER FOR THERMAL MANAGEMENT

This application claims the benefit, under 35 U.S.C. §365 of International Application PCT/US2013/048124 filed Jun. 27, 2013 which was published in accordance with PCT Article 21(2) on Dec. 31, 2014 in English.

FIELD OF THE INVENTION

This invention relates to a device having a cover that performs thermal management providing for cooling of internal heat generating components via at least a combination of convective, conductive, and radiant cooling while maintaining the cover within a prescribed temperature range.

BACKGROUND OF THE INVENTION

Thermal management remains a significant challenge in consumer devices such as set top boxes and the like. As set top boxes, for example, exhibit increased functionality and device complexity with the introduction of additional components such as smart card readers, more heat is generated by and introduced into the device. That heat needs to be dissipated. In turn, there is a continuing need for an improved thermal management system in such devices.

Thermal management becomes more challenging in the face of pressures to miniaturize and reduce the size of set top boxes due to consumer preference. A greater degree of compactness coupled with an increased number of internal components and functionalities further concentrates heat within the device in a smaller space.

Not only is the realization of an effective thermal management system challenging for these devices such as set top boxes, but it represents a further expense over the basic costs for the enclosure (i.e., cover) and the components themselves. Thus, there is a need for a thermal management system, which is effective in its role of cooling components of a device such as a set top box and which does not introduce a significant cost increase in the overall manufacture of the consumer device (e.g., the set top box).

SUMMARY OF THE INVENTION

The aforementioned shortcomings in the prior art are solved by the present apparatus that includes a cover or enclosure for one or more heat generating components of the apparatus, with the cover providing at least a combination of conductive, convective, and radiant cooling for the heat generating components while maintaining the apparatus within a prescribed temperature range. Conductive cooling is realized by two or more depression regions in the cover, with each depression region being thermally coupled to one or more heat generating components. Convective cooling of both the heat generating components and the thermally coupled depression regions is realized by judicious placement of air inlets and air outlets through the cover. Outlets provided in an interior region between two adjacent depression regions also allow air flows to effectively isolate the heat generated by adjacent heat-generating components that are thermally coupled to their respective depression regions. Furthermore, the cover can be provided in a dark or black tone to increase the emissivity for an increased heat transfer due to radiant cooling. In one embodiment, the cover is treated to provide a highest possible emissivity value for its corresponding material.

In certain exemplary embodiments, air inlets are formed through one or more sidewall regions perpendicular to, and attached along an outer portion of, a peripheral region of the cover. When two or more sidewall regions are employed, it is preferred that two sidewall regions are located on opposite sides of the peripheral region of the cover.

In certain other exemplary embodiments, both the peripheral and interior regions are planar, and air outlets are also formed through at least one portion of the peripheral region, wherein at least one portion of the peripheral region is substantially parallel to the interior region. Additional air outlets may also be formed through other unused portions of the peripheral region.

In exemplary embodiments, the air inlets and air outlets are each realized as a plurality of apertures in their respective regions.

In additional exemplary embodiments, at least one of the two or more depression regions is thermally coupled to one or more of the associated heat generating electronic components via a thermal pad.

In a further exemplary embodiment, because the cover surface is capable of emitting radiant energy as the third mode of heat transfer, painting or otherwise coloring the cover in a black or dark tone can achieve a high emissivity in order to remove a larger amount of component-generated heat via radiation.

BRIEF DESCRIPTION OF THE DRAWING

The teachings of the present principles can be readily understood by considering the following detailed description in conjunction with the accompanying drawing, in which:

FIG. 1 shows an exemplary set top box cover realized in accordance with the principles of the present invention.

It should be understood that the drawings are for purposes of illustrating the concepts of the invention and are not necessarily the only possible configuration for illustrating the invention. To facilitate understanding, identical reference numerals have been used, where possible, to designate identical elements that are common to the FIGURES.

DETAILED DESCRIPTION OF THE INVENTION

The present description illustrates the principles of the present invention for thermal management of a device or apparatus. It will thus be appreciated that those skilled in the art will be able to devise various arrangements that, although not explicitly described or shown herein, embody the principles of the disclosure and are included within its spirit and scope.

Apparatus and techniques providing one or more depression regions in a heat sink that is enclosed by a separate device cover have been presented in detail in several co-pending patent applications assigned to the common assignee hereof. The co-pending applications, which are incorporated by reference herein in their entirety, are:

U.S. patent application Ser. No. 13/580,482 published as U.S. Patent Application Publication No. 2012/0307455 entitled, "Miniature Multilayer Radiative Cooling Case With Hidden Quick Release Snaps"; and PCT Patent Application No. PCT/US2012/028000 published as International Patent Application Publication No. WO2012/122230 entitled, "Set Top Box Or Server Having Snap-In Heat Sink And Smart Card Reader".

These references each provide depression regions in a heat sink, which is separate and apart from the electronic device cover.

The terms "cover" and "enclosure" are intended to be synonymous and co-extensive in meaning when employed in this description. These terms may therefore be used interchangeably herein without limitation or loss of general meaning. These terms refer to an outer structure extending, either partially or entirely, over and around the components of the electronic device being enclosed or covered. Generally, the cover is a substantially box-like structure in the case of most consumer electronic devices. The cover can comprise multiple parts that are fastened together to form a substantially unified structure in appearance.

Thermal management in accordance with the principles of the present invention provides for cooling of internal heat generating components via a combination of convective and conductive cooling, while maintaining the cover within a prescribed or predetermined temperature range. The thermal management techniques described herein are all passive in nature and they are all realized via a uniquely realized cover in combination with the heat generating components of the electronic device. For the preferred embodiments, the passive techniques are sufficiently capable of managing the heat generated by the device components that fans or the like are not required for further cooling of the electronic device. Of course, it is contemplated that certain circumstances may lend themselves to complementing the passive thermal management techniques with more active techniques such as using one or more fans to increase the airflow through the device and the enclosure.

Electronic devices and, more particularly, consumer electronic devices are required to meet certain specifications relating to the temperature of the device generally set for consumer safety. These specifications may involve touch and component temperatures in a 50 degree Celsius ambient environment without the aid of a fan. Electronic devices in the prior art, as noted above, managed the generated heat from the components via a specialized heat sink structure that was separated from the actual outer enclosure or cover. Typically, the heat sink structure was separated from the outer cover to allow the cover to meet the required temperature specifications that were not fully met by the heat sink structure itself. Since these additional structures add to manufacturing expense and complexity, it was determined by the present inventors that a cost effective solution to the problem would be to combine both the thermal management properties of a heat sink structure together with the enclosing properties of the outer cover in order to manage the internally generated heat. In this way, the need for an additional separate heat sink or heat spreader is avoided and the electronic device manufacturing process is simplified.

According to the principles of the present invention, thermal management is partially achieved in the present electronic device by providing a cover (e.g., a top cover) having one or more depression regions, wherein each depression region is thermally coupled to one or more heat generating components of the electronic device. Thermal coupling is realized via direct contact between the depression region and its associated heat generating components. Thermal coupling may also be realized through a thermal pad (not shown in the FIGURES), which can be positioned between the depression region and the associated one or more heat generating components of the electronic device. The conductivity of the thermal pad can regulate the amount of heat transferred from one or more of the associated heat generating components to each depression region. For example, the conductivity of the thermal pad can be selected such that heat conduction is sufficient to maintain the electronic components at or below their operating temperatures, while preventing the device or top cover from exceeding its touch temperature specification (e.g., if conductivity is too high, it may result in the cover becoming too hot). Thermal pads are well known in the art and will not be described in any further details.

Each depression region 106 in the cover 100 is realized as an indentation, or a down bump, or a dimple as shown in FIG. 1. The size of the depression region may vary in accordance with the requirements of the thermal management associated with that depression region, the number of heat generating components that are thermally coupled to the depression region, and other similar factors. In the example of FIG. 1, two depression regions 106 are located centrally on top cover 100. These depression regions are positioned to thermally couple with heat generating components shown as heat generators 1 and 2, with heat generator 1 depicted as hard drive 101 and heat generator 2 depicted as a printed circuit board 103. The heat generating components are mounted on a circuit board 102, which includes other components such as integrated circuits and the like, and which underlies at least a portion of the top cover 100 that includes depression regions 106.

Each depression region acts as a heat sink or heat spreader for at least one heat generating component of the electronic device. It transfers heat away from the heat generating component to the cover and ultimately away from the electronic device, via dissipation into the ambient environment surrounding the enclosed device.

The depression regions 106 are surrounded by one or more peripheral regions 105 along the periphery of the top surface of the cover 100. An interior region 104 on the top surface of the cover 100 separates one depression region from another. When more than two depression regions are formed into cover 100, corresponding interior regions are then defined in the region of the cover that separates any pair of depression regions. In the example of FIG. 1, the interior region 104 and peripheral regions 105 are planar regions.

Cover 100 also includes one or more sidewall regions 107 that extend down from, and substantially perpendicular to the top surface of the cover 100. When the cover does not exactly resemble a parallelepiped as shown in FIG. 1, it is contemplated that other regions that extend from a top surface of the cover may act as sidewall regions. The rectilinear structure of cover 100 shown in the FIGURE is intended as an exemplary shape for an electronic device cover and it is contemplated that other cover shapes including curved shapes and surfaces can be employed for cover 100. The cover can also be referred to as a contoured cover, and the interior and peripheral regions can have non-planar surfaces.

The cover is generally fabricated using a metal or composite that is suitable to provide strength, aesthetic appearance, and durability. In the present exemplary embodiments, it is preferred that a thermally conductive metal, such as aluminum or steel or the like, be employed for top cover 100. Thermal conductivity, cost, weight, strength, durability, and manufacturability, to name a few, are all factors that can be considered in selecting a cover material that is appropriate for use.

According to the principles of the present invention, thermal management is partially achieved in the present electronic device by providing a cover (e.g., a top cover) having a number of openings or apertures that serve as air inlets and outlets to provide a pathway for convective cooling and thermal isolation. Air outlets are positioned through planar interior region 104 between the two depression regions 106 on the cover. Air outlets can also be placed through one or more planar peripheral regions 105 as shown in FIG. 1. The unused areas of planar peripheral regions depicted in FIG. 1 can also be used for placing additional air outlets in order to achieve a requisite degree of convective air cooling for the heat generating components and the overall electronic device.

As shown in FIG. 1, openings serving as air inlets are placed through one or more sidewall regions 107. In fact, the sidewalls 107 in FIG. 1 are opposed to each other and they each include air inlets. Since it is a rectilinear structure, cover 100 from FIG. 1 could also be configured to have four possible sidewalls for placement of additional air inlets. The two additional sidewalls would be substantially perpendicular to the top surface of cover 100 and they would span the side region from each end sidewall 107 shown in FIG. 1 (e.g., one of these additional sidewalls would be adjacent to the heat generators 1 and 2, and would hide these components from view in FIG. 1).

The air inlets and air outlets combine to achieve a cooling convective airflow. In the example of FIG. 1, due to the natural convective environment around the hot components, hot air will exit through the openings at the interior and peripheral regions of the top surface of the cover, while cooler air will enter through the openings from the sidewalls, thus generating an air flow around the hot components. More specifically, the one or more air inlets in the sidewall regions 107 and air outlets positioned in the planar interior region 104 provide air flows as effective thermal isolation of the heat generated by the components associated with one depression region from the heat generated by the components associated with the other depression region. Heat is substantially prevented from flowing from one heat generating component to the other heat generating component. Again, this convection is a passive process that is realized without the use of cooling fans or any other such active mechanism.

In addition to providing thermal isolation, persons skilled in the art will recognize that the combination of air inlets and outlets provides convective cooling for at least some portion of the heat generating components and for at least some portion of the depression regions. Additional cooling for the components and for the depression regions is provided by the additional outlets—in combination with the air inlets—positioned through the planar peripheral region or regions of the contoured cover. It is understood that the configurations of air inlets and outlets (e.g., positions, dimensions and number of openings) for effective convective cooling will depend on the specific design and/or layout of the components in the particular electronic device.

Although not depicted in the FIGURE, but according to a further exemplary embodiment, painting or otherwise coloring (e.g., including processes such as anodization) the cover in a dark tone or even a black tone can achieve a high emissivity in order to remove a larger amount of component generated heat via radiation because the cover surface is capable of emitting radiant energy as the third mode of heat transfer. According to the principles of the invention related to this embodiment, one or more surfaces of the top cover exhibits a dark coloration such as black in order to improve radiant cooling of the electronic device.

In accordance with the principles of the present invention, this cover allows the electronic device to pass the thermal specifications set forth by the customer without the use of a fan in at least a 50 degree Celsius ambient environment. The electronic device including the contoured and vented cover is capable of maintaining the electronic device in a prescribed range of temperatures.

While the thermal management of the subject matter in the present disclosure has been described in an exemplary embodiment resembling a set top box, it should be understood by persons skilled in the art that the present principles can be applied to any type or shape of electronic device having heat generating components.

Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure).

Finally, all examples and conditional language recited herein are intended to aid the reader in understanding the principles of the invention and the concepts contributed herein for furthering the state of the art. The principles of the present invention are therefore to be construed as being without limitation or restriction to such specifically recited examples and conditions.

Having described one or more embodiments for thermal management of an electronic device herein, which one or more embodiments are intended to be illustrative and not limiting, it is noted that modifications and variations can be made by persons skilled in the art in light of the above teachings. It is therefore to be understood that changes may be made in the particular embodiments of the invention disclosed which are within the scope and spirit of the invention. While the forgoing is directed to various embodiments of the present invention, other and further embodiments of the invention may be devised without departing from the basic scope thereof.

The invention claimed is:

1. A cover for an electronic device comprising:
   a plurality of heat generating electronic components, wherein said cover comprises:
   at least two depression regions, wherein each depression region is adapted to be thermally coupled to at least a respective one of said heat generating electronic components, at least one of said depression regions being realized as a solid continuous surface devoid of any opening therein;
   a peripheral region surrounding at least partially a first and a second of said depression regions;
   an interior region positioned between the first and second depression regions;
   at least one airflow aperture formed on one or more sidewall regions that extend along an outer edge of the peripheral region; and
   at least one airflow aperture formed through the interior region.

2. The cover of claim 1, wherein at least one of the peripheral region and the interior region is planar.

3. The cover of claim 1 or claim 2, wherein said cover comprises at least one airflow aperture formed through at least one portion of the peripheral region.

4. The cover of claim 1 or claim 2, wherein said cover comprises at least two airflow apertures formed on at least two sidewall regions such that two of the at least two sidewall regions are positioned on opposite edges of the peripheral region.

5. The cover of claim 4, wherein the peripheral region and the interior region are planar, and said cover comprises at least one airflow aperture formed through at least one portion of the planar peripheral region and wherein the at least one portion of the planar peripheral region is substantially parallel to the planar interior region.

6. The cover of claim 1, wherein at least one of the first and second depression regions is thermally coupled to the one or more heat generating electronic components via a thermal pad.

7. The cover of claim 1, wherein one or more surfaces of the cover exhibits a dark coloration.

8. An electronic device comprising:
a plurality of heat generating electronic components,
a cover, wherein said cover comprises:
at least two depression regions, wherein each depression region is adapted to be thermally coupled to at least a respective one of said heat generating electronic components, at least one of said depression regions being realized as a solid continuous surface devoid of any opening therein;
a peripheral region surrounding at least partially a first and a second of said depression regions;
an interior region positioned between the first and second depression regions;
at least one first airflow aperture formed on one or more sidewall regions that extend along an outer edge of the peripheral region; and
at least one second airflow aperture formed through the interior region.

9. The electronic device of claim 8, wherein said cover comprises at least one airflow aperture formed through at least one portion of the peripheral region.

10. The electronic device of claim 8, wherein said cover comprises at least two airflow apertures formed on at least two sidewall regions such that two of the at least two sidewall regions are positioned on opposite edges of the peripheral region.

11. The electronic device of claim 10, wherein the peripheral region and the interior region are planar, and said cover comprises at least one airflow aperture formed through at least one portion of the planar peripheral region and wherein the at least one portion of the planar peripheral region is substantially parallel to the planar interior region.

12. The electronic device of claim 8, wherein one or more surfaces of the cover exhibits a dark coloration in order to improve radiant cooling of the electronic device.

13. The electronic device according to claim 8, wherein said cover is a top cover of said electronic device and wherein said airflow aperture formed on one or more sidewall regions that extend along an outer edge of the peripheral region is an air inlet and said airflow aperture formed through the interior region is an air outlet.

14. The electronic device according to claim 13 wherein:
at least one of said peripheral region and at least one of said interior region are planar;
said sidewall portions comprises at least two sidewall portions;
said cover includes an upper planar portion that includes said peripheral region in a vicinity of an outer periphery of the upper planar portion and one or more planar interior regions;
said first and second depression regions extend down from the upper planar portion;
said at least one air inlet comprising air inlets formed through each of the sidewall portions;
the air inlets and the air outlet cooperate to provide a convective air flow for cooling the heat generating components thermally coupled to the depression regions by transferring generated heat away from the electronic device; and
heat generated by any heat generating devices thermally coupled to one depression region is effectively isolated from heat generated by any of said heat generating devices thermally coupled to another depression region adjacent to the one depression region at least in part via the air outlet through the planar interior region between the one and the another depression regions.

15. The electronic device according to claim 8, wherein at least one of the peripheral region and the interior region is planar.

16. The electronic device according to claim 8, wherein at least one of the first and second depression regions is thermally coupled to the one or more heat generating electronic components via a thermal pad.

* * * * *